United States Patent [19]

Willberg et al.

[11] Patent Number: 4,889,242

[45] Date of Patent: Dec. 26, 1989

[54] DEVICE FOR TESTING AND SORTING ELECTRONIC COMPONENTS, MORE PARTICULARLY INTEGRATED CIRCUIT CHIPS

[75] Inventors: Hans H. Willberg, Munich; Ekkehard Ueberreiter, Raubling, both of Fed. Rep. of Germany

[73] Assignee: Multitest Elektronische Systeme, Fed. Rep. of Germany

[21] Appl. No.: 868,290

[22] Filed: May 28, 1986

[30] Foreign Application Priority Data

Jun. 4, 1985 [DE] Fed. Rep. of Germany ....... 3520031
Aug. 30, 1985 [DE] Fed. Rep. of Germany ....... 3531143
Aug. 30, 1985 [DE] Fed. Rep. of Germany ....... 3531119
Aug. 30, 1985 [DE] Fed. Rep. of Germany ....... 3531120
Aug. 30, 1985 [DE] Fed. Rep. of Germany ....... 3531142

[51] Int. Cl.$^4$ .............................................. B07C 5/344
[52] U.S. Cl. .................................. 209/573; 324/158 F
[58] Field of Search ............................... 209/573, 574; 193/38–41; 221/68, 178, 251, 262, 264, 265, 290, 291, 298; 324/73 R, 73 PC, 73 AT, 158 F

[56] References Cited

U.S. PATENT DOCUMENTS

| | | | |
|---|---|---|---|
| 3,727,757 | 4/1973 | Boissicat | 209/573 |
| 4,222,166 | 9/1980 | Kurek et al. | 414/404 X |
| 4,478,352 | 10/1984 | Amundson et al. | 209/573 X |
| 4,588,092 | 5/1986 | Moechnig et al. | 209/573 |
| 4,593,820 | 6/1986 | Antonie et al. | 209/573 |
| 4,700,132 | 10/1987 | Yarbrough et al. | 324/158 F |

FOREIGN PATENT DOCUMENTS

| | | |
|---|---|---|
| 0007650 | 2/1980 | European Pat. Off. . |
| 3217531 | 11/1983 | Fed. Rep. of Germany . |
| 3340183 | 5/1985 | Fed. Rep. of Germany . |
| 60-15568 | 1/1985 | Japan ................ 324/158 F |

*Primary Examiner*—Johnny D. Cherry
*Assistant Examiner*—Edward M. Wacyra
*Attorney, Agent, or Firm*—Wood, Dalton, Phillips, Mason & Rowe

[57] ABSTRACT

In a device for testing and sorting electronic components, and more particularly integrated circuit chips, the untested components are arranged in parallel magazine channels, which are arranged on a gradient, of an input magazine. The tested components are collected in an output magazine set up in the same way. The magazines are to be suitable, more particularly, for taking up CC (chip carrier) components. These components have a free rear surface upon which they can slip in the magazine channels arranged on a gradient. The magazines consist of a flat base plate (15), upon which guide rails, which are T-shaped in cross section, are mounted in such a way that they limit the magazine channels at the side and at the top, the guide rails being connected with each other to form a block which, as a whole, is capable of being exchanged. The components are tested in a channel, their connecting contacts being connected up with corresponding test contacts. The contact movement is initiated by the components here, while the test contacts are fixed. For this purpose, the components are displaced into the test channel crosswise to the direction of transportation. A shuttle is arranged between the output magazine and a test unit (6) for the components, containing the test channel. The shuttle sits on a shuttle sliding carriage with which it is possible to move along the individual magazine channels. The shuttle may be adjusted in respect of the shuttle sliding carriage executing just the conveying movement, between a loading position, a transporting position and an unloading position. In order to be able to test the components successively in the test unit, they are isolated by means of an isolating apparatus. This consists of two stopping elements which are arranged one after another with interspacing in the direction of transportation of the components, which are capable of being adjusted transverse to the direction of transportation and which are connected with each other by means of a pendulum mechanism. The latter guarantees that the stopping elements are alternately dipped into or drawn out of an isolating channel.

17 Claims, 10 Drawing Sheets

DEVICE FOR TESTING AND SORTING ELECTRONIC COMPONENTS, MORE PARTICULARLY INTEGRATED CIRCUIT CHIPS

The invention relates to a device for testing and sorting electronic components, more particularly integrated circuit chips, having an input magazine for the untested components and an output magazine for the tested components, at least one of which magazines has a plurality of parallel magazine channels arranged, on a gradient, for the components, guide rails forming limits of the magazine channels A first aspect of the invention is directed to the construction of the magazines.

In the case of a known device (German Offenlegungsschrift No. 33 40 183) the input magazine and the output magazine consist of a base plate provided with guide slots. Guide rails are arranged with interspacing over the base plate. These magazines serve to take up so-called dual-in-line components which are provided, on two opposite sides, with connecting contacts. The connecting contacts protrude from a flat surface of the component. The connecting contacts run in the guide slots. The guide rails form an upper limit for the components, i.e. the upper side of the components slides along under these guide rails. Very close contact of the two flat sides of the components is desired, on the one hand with the base plate, and on the other hand with the guide rail lying above them, in order to be able to heat the components up to a certain test temperature before testing The magazines developed in the previously described manner cannot be used for modern CC components (chip carrier), as these have connecting contacts on all four sides and guidance in guide slots of the base plate is no longer possible.

The underlying object of the invention is therefore to form the input and output magazine for a device of the kind described above in such a way that modern CC components can be stored and guided in a precise manner therein. In addition, it should still be possible to bring the components up to a desired temperature during the time in which they are located in the input magazine.

The object is achieved according to the invention as the magazine has a flat base plate, upon which the guide rails are mounted in such a way that they limit the magazine channels at the side and the guide rails are connected with each other to form a block which, as a whole, is capable of being exchanged.

The exchangeable block allows the device according to the invention to be changed over quickly for handling components of different dimensions. The concept with the flat base plate and the lateral guide rails is based on the fact that the components are transported lying on their rear surface, in which case an intense temperature effect is possible by way of the contact area between the base plate and the rear surface of the components.

An advantageous development of the first aspect of the invention can lie in the fact that the guide rails are T-shaped in cross section and rest upon the base plate with their vertical legs. Guide rails formed in this way give the components lateral guidance with their vertical limbs and vertical guidance with their cross-limbs.

A further advantageous development of the first aspect of the invention can lie in the fact that facing adjacent faces of cross-limbs of the guide rails, which are T-shaped in cross section, form a gap into which there dip annular brake rollers which are suspended on carrier rods, which run perpendicular to the direction of transportation of the components, that the internal diameter of the annular brake rollers is substantially greater than the diameter of the carrier rods and that the brake rollers sit on the base plate and may be lifted by components slipping down in the magazine channels, thereby reducing the components' slipping speed. It is desirable for the speed of the components slipping in the magazines not to be allowed to become too great, because the components, especially if they are made of ceramic material, could be damaged when striking an obstacle at the end of the relevant magazine.

A second aspect of the invention relates to a device for testing and sorting electronic components, more particularly integrated circuit chips, in which the components are guided through a test channel and their connecting contacts are there connected up with corresponding test contacts. The second aspect of the invention is directed at the construction of the test channel.

So-called dual-in-line components may be tested and sorted with known devices of the kind considered in connection with the second aspect of the invention (DE-OS No. 32 17 531, EP-A-0077650, U.S. Pat. No. 3,727,757). For the establishment of the electrical connection between the connecting contacts of the components and the test contacts, a force is exerted on the test contacts by means of a magnetic adjusting apparatus, resulting in movement of the test contacts in the direction of the connecting contacts. In other words, in these known devices, the component to be tested is in each case held in the rest position in the test channel, while the test contacts are advanced to the connecting contacts of the component through movement. For this purpose, the test contacts must be constructed so that they are long and flexible, i.e. be capable of being bent. On account of their length, they have a comparatively high level of self-inductance. In addition, on account of their length, there are established comparatively high capacitances between the contacts. Further capacitances are established with the magnetizable components which effect their movement. The inductance and capacitance mentioned establish harmful leakage impedance which, more particularly, precludes testing at the high frequencies for which modern components are to be used.

Furthermore, the devices described above are not suitable for the handling of so-called CC components (chip carrier), as these have connecting contacts in all four edge regions.

The underlying object of the invention is therefore, furthermore, to form a device of the kind previously described in such a way that the harmful leakage impedance which precludes operation with high frequencies is reduced and handling of modern CC components is possible.

The object is achieved according to the invention as the components may be displaced in the test channel perpendicular to the direction of transportation and may thus be connected up with the fixed test contacts. The solution according to the invention thus rests on another principle of construction. The test contacts can be kept shorter, and no longer need to be capable of being bent outwards. In addition, magnetizable elements no longer need to be provided close to the test contacts, to effect their deflection. Instead, the component itself is moved towards the test contacts which themselves then experience no change.

An advantageous development of the second aspect of the invention can lie in the fact that, provided for the purpose of displacing the components in the test channel, there is a test cage containing a test area which forms a part of the test channel, that the test contacts are formed by test pins arranged in a fixed manner in a test pin holder and that a displacement drive is provided for the test cage.

A practical development of the test cage for handling components with gold contacts, more particularly CLCC's, can consist in providing the test cage with holes through which the fixed test pins can dip, upon movement of the test cage, into the test area for the purpose of contacting the component.

On the test pin holder, an area can be left free between the test pins, which area, if desired, accommodates earth capacitance with which, when testing, the actual conditions, which prevail when using the component to be tested on a printed circuit board, can be simulated.

In order to guarantee a reliable connection between the test pins and the connecting contacts of the CLCC's, the end region of the test pins facing the test cage can be made capable of being displaced telescopically in respect of the main part of the test pins and a pin head, preferably in the form of a serrated crown, is provided in addition in this end region.

In the case of components with tinned connecting contacts, more particularly PLCC's, according to another further development of the invention test pins made of flat sheet metal can be used, said test pins being guided in supporting slots of the test pin holder and/or the test cage in such a way that they are supported at their edge remote from the component to be tested. The dimensions should then be chosen so that the connecting contacts of the component located in the test cage come, upon displacement of the test cage, into frictional contact with the other edge of the test pins. As a result of the frictional contact, layers of corrosion, which can form in the case of the tinned connecting contacts, are abraded and a perfect contact connection is guaranteed even in the case of these components.

It is advantageous, furthermore, to give the test pins last mentioned a widened section, which tapers at the end, in the region in which they are to touch connecting contacts of the components to be tested.

A construction which is favourable in terms of production engineering results if both the test pin holder and the test cage are provided on, in each case, two opposite sides with projections containing the supporting slots for the test pins.

A third aspect of the invention relates to a device for testing and sorting electronic components, more particularly integrated circuit chips, having an input magazine for the untested components, having a test unit, which has a test channel to which the components are fed one after another from the input magazine, having a stationary output magazine, which has inclined magazine channels arranged side by side for the tested components; having a sliding carriage, which may be moved between the output magazine and the test unit; and having a shuttle, which is arranged on the sliding carriage and which has a shuttle channel, for transferring the tested components from the test channel output to the input of a selected magazine channel, the shuttle being adjustable between an unloading position, in which shuttle channel and magazine channel are in alignment, and a transporting position, in which shuttle channel and magazine channel are staggered. The third aspect of the invention is directed at the construction of the shuttle.

In the case of a known device (German Offenlegungsschrift No. 33 40 183) of the kind considered in connection with the second aspect of the invention, the shuttle sits fast on the shuttle sliding carriage. The shuttle sliding carriage is mounted on two guide rods in a longitudinally displaceable manner and may be rotated as a result of the ability of the one guide rod to be twisted eccentrically about the other guide rod. As a result of the rotation the shuttle can be adjusted between a transporting position and an unloading position. In the unloading position the shuttle channel is in alignment with the relevant magazine channel of the output magazine. In the transporting position the output of the shuttle channel is somewhat lowered in respect of the input of the magazine channels of the output magazine so that a component located in the shuttle channel abuts against the lower edge of the magazine channels and, upon movement of the shuttle sliding carriage with the shuttle, slides along the forward edge of the output magazine. This sliding movement is undesirable, because it results in abrasion of the front edge of the output magazine and, more particularly, in the case of modern CC components (chip carrier) can result in damage to, or charging of, the front connecting contacts. The underlying object of the invention is therefore, furthermore, to avoid the disadvantage described above.

The object is achieved according to the invention as the shuttle sliding carriage is only constructed to execute the conveying movement, the shuttle may be adjusted in respect of the shuttle sliding carriage between the unloading position and the transporting position, and provided on the shuttle sliding carriage there is a stop portion which does not participate in the adjusting movement of the shuttle and which obstructs the shuttle channel in the transporting position.

A component located in the shuttle channel in the device according to the invention is thus prevented by the stop portion from leaving the shuttle channel in the transporting position and no longer slides along the forward edge of the output magazine.

An advantageous development of the third aspect of the invention can lie in the fact that the movement of adjustment of the shuttle takes place through rotation about an axis which runs approximately through the centre of a component located in the shuttle channel. This measure guarantees that, when the shuttle swings, the ends of the shuttle channel execute an exclusively circular movement and no more translational movement, as a result of which the gap between the shuttle and the output magazine, on the one hand, and the shuttle and a turning apparatus, which is mentioned again below, on the other hand, can be kept very narrow. A narrow transition gap is aimed at for the sake of unhindered transportation of the components.

In the known device, the test channel is curved at the end towards the shuttle. The shuttle is loaded there in the transporting position. In this position the shuttle channel and the test channel are not exactly in alignment with each other, but together enclose an obtuse angle of almost 180°. By contrast, in developing the third aspect of the invention considered here it is proposed that the shuttle be capable, in addition, of being adjusted and moved into a loading position in which it is closed on its output side by means of the stop portion and is capable of being brought, on its input side, into correspondence with a turning apparatus, containing a turning channel, in such a way that the shuttle channel and the turning channel are in alignment with one another. The turning apparatus not only guarantees orientational alignment of the shuttle channel and the turning channel, but also makes it possible, moreover, for CC components, which are introduced into the input magazine lying on their flat rear sides, to be fed after testing, in the same position to the output magazine also, in which case, however, the front edges of the components, which in the input magazine lie at the front in the direction of transportation, lie at the back in the output magazine. In this way, components, which have been put into the input magazine from a stack magazine, can in turn be drawn off from the output magazine to fill an empty stack magazine, the connecting contacts of the components being orientated in the same way as before testing with regard to the filling end of the stack magazine.

The turning channel of the turning apparatus is advantageously closed at one end, the turning apparatus being capable of being rotated about an axis between a loading position, in which the turning channel is in alignment with the test channel, and an unloading position in which the turning channel is in alignment with the shuttle channel.

Another development of the third aspect of the invention can lie in the fact that the shuttle sliding carriage has a sliding portion, which is mounted on a guide rod in a longitudinally displaceable manner, yet is connected therewith in a manner secure against rotation, and that the sliding portion is connected with the shuttle for the purpose of transmitting the rotational movement.

The stop portion is preferably constructed so that on its side facing the shuttle it has a cylindrically curved surface and tapers towards the end, lying with its pointed end in the gap between the shuttle and the output magazine.

A fourth aspect of the invention relates to a device for testing and sorting electronic components, more particularly integrated circuit chips, having an input magazine, which is on a gradient, for the untested components; having an isolating apparatus which is arranged at the output end of the input magazine and which contains an isolating channel which likewise is on a gradient, and having a test unit, to which the components are fed successively. The fourth aspect of the invention is directed at the special construction of the isolating apparatus.

In a known device (German Offenlegungsschrift No. 32 17 531) of the kind considered in connection with the fourth aspect of the invention, the isolating apparatus consists of a small, continuous conveyor belt which is arranged at the end of the output magazine above the running surface for the components and which, with its underside, presses on the components to be isolated. The belt itself is made of rubber so that the components picked up by the conveyor belt are not damaged. A light gate is provided directly behind the small conveyor belt. When the leading edge and the trailing edge of a component pass, the gate gives a signal which is used to control the drive for the conveyor belt. The known device described above has, it is true, proved good, yet is still in need of improvement. This is because the conveyor belt itself is susceptible to wear and requires a separate drive.

The underlying object of the invention is therefore, furthermore, to create a device of the kind previously described which is less susceptible to disturbance and wear.

The object is achieved as the isolating apparatus has two stopping elements which are arranged one after the other with interspacing in the direction of transportation of the components, which are capable of being adjusted perpendicular to the direction of transportation and which are connected with each other through a pendulum mechanism by means of which alternately the one stopping element is dipped into the isolating channel, whilst the other is drawn back out of it, and vice versa.

The isolating apparatus thus formed operates, for the most part, in a manner free of wear as the components are either stopped or released without a frictional pressure being exerted on them for the purpose of forward movement.

An advantageous development of the fourth aspect of the invention can lie in the fact that the two stopping elements have a distance between them of approximately one and a half lengths of the components to be isolated, so that the stopping element lying downstream in the direction of transportation, in dipping into the isolating channel, clamps the penultimate component.

Another further development can consist in mounting the two stopping elements in a resilient manner to avoid damage to the components.

A pendulum frame can be used to realise the pendulum mechanism, its one end being connected with the stopping element lying upstream in the direction of transportation of the components, said pendulum frame being pivoted about a swing axis perpendicular to the direction of transportation of the components and the other end of said pendulum frame being connected by way of a leaf spring with the stopping element lying downstream in the direction of transportation of the components. The stopping elements can, furthermore, be connected directly with each other by way of at least one further leaf spring.

In order to give the pendulum mechanism a form of basic orientation, the stopping element lying upstream in the direction of transportation of the components can be pretensioned, by means of a pretension spring, in such a way that it dips into the isolating channel or closes the latter at the end.

Another practical development can consist in the fact that the two stopping elements dip from below into the oblique isolating channel, the stopping element which lies downstream in the direction of transportation of the components pressing the penultimate component, when dipping in, against the upper isolating channel limit, whilst the stopping element lying upstream, when dipping in, obstructs the transporting channel or forms a stop for the last component.

In order to avoid using a separate drive, which is provided in the case of the known isolating apparatus described above, it is proposed, furthermore, that there be added to the isolating apparatus according to the invention, in the direction of transportation, a tipping apparatus which has a tipping channel. The tipping apparatus is capable of being tipped about a tipping axis perpendicular to the direction of transportation of the components, between a loading position and an unloading position, the tipping apparatus, when in the loading position, pressing the stopping element lying upstream in the direction of transportation of the components against the action of the pretension spring in the position of release and the tipping channel coming to lie in alignment with the isolating channel, so that the last component can run into the one end of the tipping channel until it meets with a stationary stop at the other end of the tipping channel, and the tipping channel of the tipping apparatus, when in the unloading position, being in alignment with a test channel of the test unit such that, in the unloading position, the component can run out of the tipping channel, which in this case is no longer closed by the stationary stop, into the test channel.

An exemplary embodiment of the invention is described in the following with the aid of the drawings, taking all four aspects into consideration.

Figure 1:
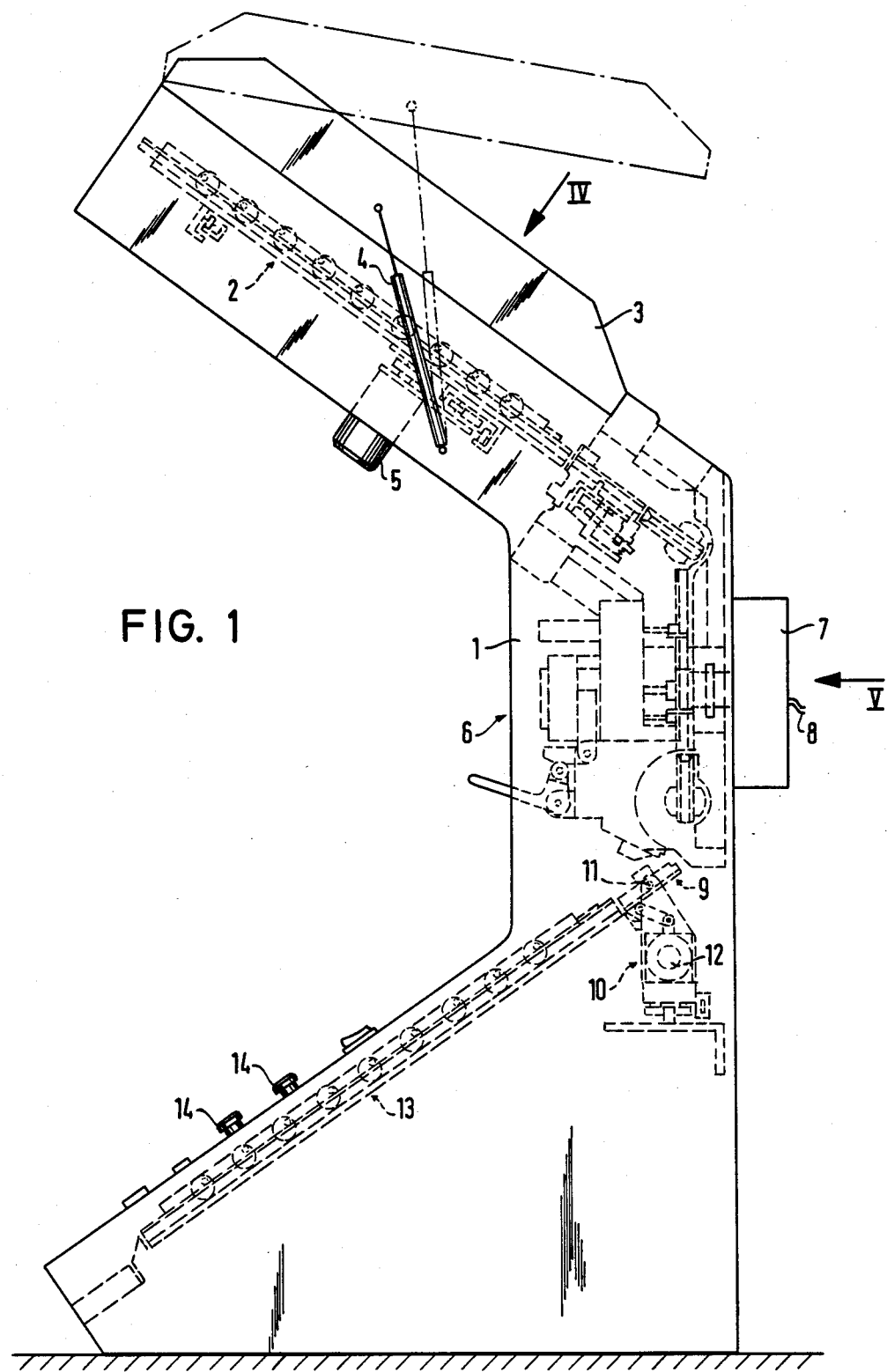
FIG. 1 shows a side view of the device.

The device, a side view of which is shown in the Figures, is accommodated in a housing 1. An input magazine 2 for the components is arranged obliquely in the upper part of the housing so that the components located therein slip obliquely downwards through the gravitational force. Arranged above the input magazine 2 there is a cover 3, which, in order to make the input magazine 2 accessible, may be rotated upwards and be supported in this rotated position, by means of resilient telescopic rods 4.

The input magazine 2 has a plurality of magazine channels (not visible here), in which the components are arranged. Furthermore, the input magazine may be moved by means of a driving motor 5 in a manner perpendicular to the drawing plane in order to bring a desired magazine channel into alignment with the input opening on a test unit 6.

In the stationary test unit 6, the components are checked individually one after another. The test unit 6 is, for this purpose, connected by way of a connector 7 and a cable with an evaluating computer (not represented). On the basis of the electrical signals fed to the evaluating computer, the latter determines whether the components are "good" or "bad". In the case of the "good" component it also distinguishes between various quality grades. The evaluation results are fed in turn to the device by way of the cable 8.

Arranged below the checking unit there is a shuttle 9 which is provided with a channel for taking up a component. The shuttle 9 is arranged on a shuttle sliding carriage 10 and may be swung about an axis 11 running in a manner perpendicular to the plane of the drawing. The shuttle sliding carriage 10 is, furthermore, arranged on a guide rod 12 so that it may be displaced longitudinally. The guide rod 12 likewise runs in a manner perpendicular to the plane of the drawing.

Fixed below the shuttle 9 there is an oblique output magazine 13. This likewise has a plurality of oblique magazine channels to take up the tested components. Each magazine channel is assigned to a quality grade for the components. On the basis of the evaluation signals fed to the device from the evaluating computer, the shuttle sliding carriage 10 moves with the shuttle 9, after taking up a component from the test unit 6 into a position in which it is in alignment with that magazine channel of the output magazine 13 which corresponds to the determined quality grade, and delivers the component to this magazine channel.

Operating knobs of the device are denoted with the reference numeral 14.

The sorted components can then be removed from the output magazine 13 by being drawn off to fill magazine rods.

It is likewise possible for the components which have not yet been tested to be introduced into the magazine channels of the input magazine 2 by putting a rod magazine onto the corresponding magazine channel obliquely so that the rod magazine and the magazine channel are in alignment with each other.

Figure 2:
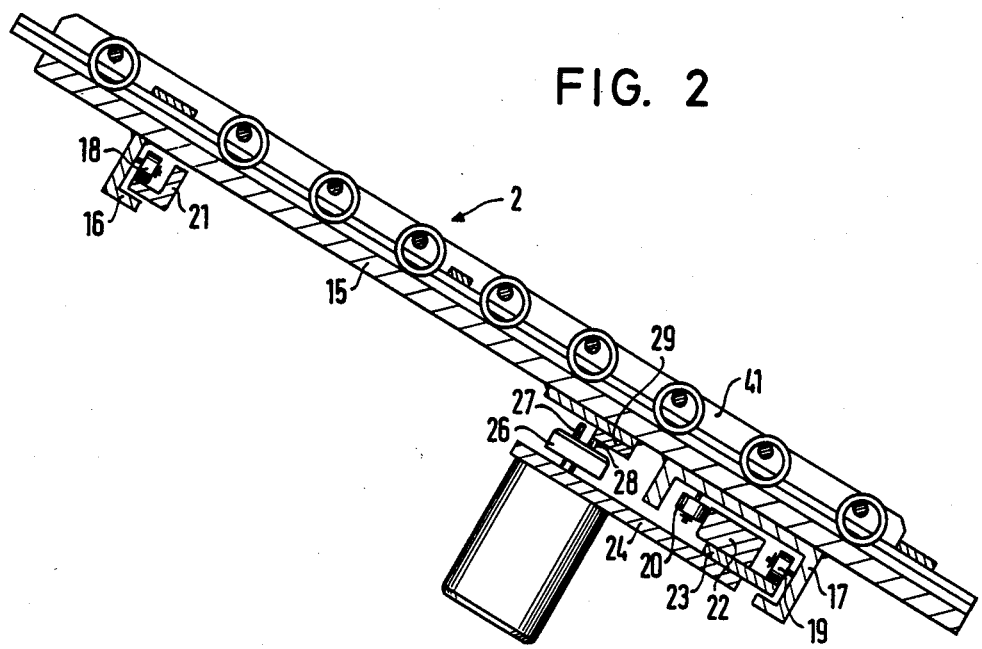
FIG. 2 shows a longitudinal section through the input magazine.
Figure 3:
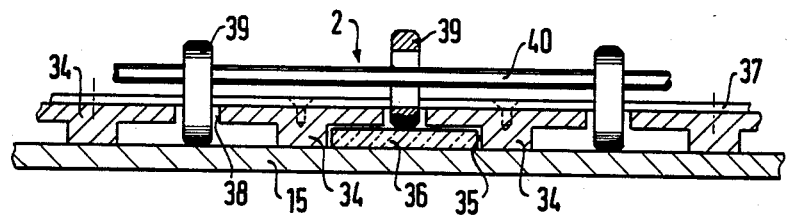
FIG. 3 shows a cross section through the input magazine.
Figure 4:
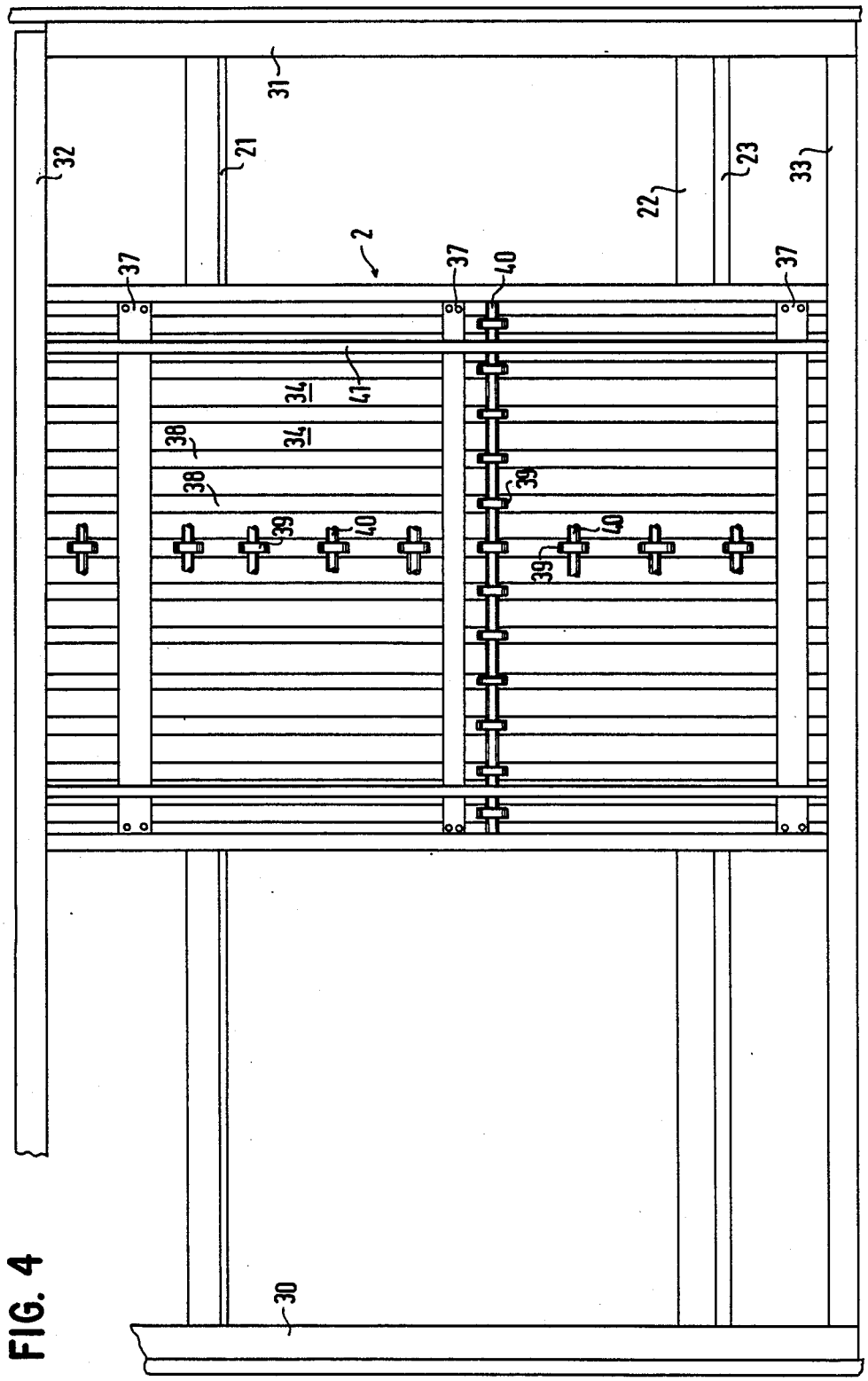
FIG. 4 shows a top view, in the direction of arrow IV in FIG. 1, of the input magazine (without cover).

FIGS. 2, 3 and 4 show the arrangement of the input magazine 2. As mentioned previously, the input magazine is capable of being moved in such a way that it can be brought to the stationary test unit 6 in a certain position. The output magazine 13 is, in principle, set up in the same way as the input magazine 2, yet with the distinction that it is stationary. A detailed description of the input magazine 2 therefore suffices.

The input magazine 2 consists of a level flat base plate 15 arranged obliquely. Secured to the underside of the base plate 15 there are angular carrier elements 16, 17 which carry rollers 18, 19 and 20. The rollers 18 run on a roller rail 21 extending in a direction perpendicular to the plane of the drawing. The rollers 19 and 20 run on roller rails 22 and 23, which likewise extend in a direction perpendicular to the plane of the drawing, and which are connected with each other. A holding plate 24, to which the driving motor 5 for the input magazine 2 is secured, sits on the roller rail 23. The driving shaft 25 of the driving motor 5 bears an eccentric head 26 to which two eccentric pins 27, 28 lying diagonally opposite are secured. These engage in catch recesses (not represented) of a transporting rail 29 which is secured to the underside of the base plate 15 and extends in a direction perpendicular to the plane of the drawing. This drive is known and has already been described in German Offenlegungsschrift No. 33 40 183.

As can be inferred from FIG. 4, the roller rails 21 and 22, 23 extend between two carrier rods 30, 31 which with further frame elements 32, 33 form a carrier frame for the movable input magazine 2.

As can be inferred more particularly from FIG. 3, guide rails 34, which are T-shaped in section and which form the magazine channels 35 for the components 36, sit on the base plate 15. The guide rails 34 are connected with each other by means of connecting strips 37 extending crosswise over the input magazine 2. Gaps 38 run between the individual guide rails 34. In this way, the guide rails 34, connected by way of the connecting strips 37, form a grid-like formation. This can, if components 36 of a different size are to be checked, be exchanged for another grid-like formation which consists of correspondingly adapted guide rails 34. The guide rails 34 are simply laid upon the base plate 15 and the the whole grid-like formation is easily lifted from the base plate 15.

Brake rollers 39, which are arranged on carrier rods 40, protrude at intervals into the gaps 38 between the guide rails 34. The internal diameter of the brake roller 39 is much greater than that of the carrier rods 40. In FIG. 4 the brake rollers 39 are only shown in one gap 38 for the sake of clarity. However, corresponding brake rollers are arranged in each of the gaps 38.

If there are no components 36 in the magazine channels 35, the brake rollers lie upon the base plate 15. If one component 36 slips down the magazine channel 35 as a result of the gravitational force, it lifts the brake rollers 39 one after another and passes through underneath them. The sliding speed of the components 36 is reduced by the brake rollers to a certain rate. This is necessary so that the components 36 are not damaged if they meet with a stop at the end of the oblique magazine channel 35. The carrier rods 40 for the brake rollers 39 sit in holding rails 41, 42 which are part of the grid-like formation.

If components are to be removed from a certain magazine channel of the input magazine 2, the input magazine is driven into the position in which the magazine channel is in alignment with an isolating channel 43 of an isolating apparatus 44. The isolating apparatus 44 shall be described below with the aid of FIGS. 7a and 7b.

The isolating apparatus consists of a base part 45 which forms a running plane 46 for the component parts. A cover plate 47, which with the base part forms the isolating channel 43, is arranged at a distance above the running plane. Two guide rods 48, which are connected with each other at their upper ends by means of a carrier block 49 and at their lower ends by means of a carrier block 50, are mounted on the base part 45 in a displaceable manner. The upper carrier block 49 bears a slide 51 which extends downwards and which in FIG. 7b blocks and in FIG. 7a does not block the isolating channel 43. Arranged between the base part 45 and the lower carrier block 50 are springs 52 which surround the guide rods 48 and which act to hold the slide 51 in the closed position shown in FIG. 7b. The slide 51 is actuated through a drive, which is not represented here and which preferably acts upon the lower carrier block 50. This drive can, for example, be an electromagnet or a pneumatically operated cylinder.

A pendulum carrier 53 is secured to the underside of the base part 45. A pendulum frame 55 is pivoted on 0 said carrier about a hinge point 54. Moreover, two leaf springs 56, 57 are clamped fast in the pendulum carrier 53. A further leaf spring 58 extends from the pendulum frame 55. The three leaf springs 56, 57, 58 are, furthermore, connected at their one end with a clamping ram carrier 59 which is provided with a clamping ram 60. The latter extends through an opening 61 in the base part 45. The other end of the two leaf springs 56, 57 and the pendulum frame 55 are connected with a closing part 62 which, at its upper end, has a closing lug 63. In FIG. 7a the closing lug blocks the isolating channel 43, whilst in FIG. 7b it does not block the channel. Located between the closing part 62 and the pendulum carrier 53 there is a spring 64 which acts to press the closing part 62 upwards, such that the closing lug 63 blocks the isolating channel 43 (FIG. 7a).

Added to the isolating apparatus 43 there is a tipping apparatus 65 which consists of a rotating part 66, which contains a rotating channel 67 and which may be rotated about an axis of rotation 68. A test channel 69 lies underneath the tipping apparatus 65.

Figure 7B:
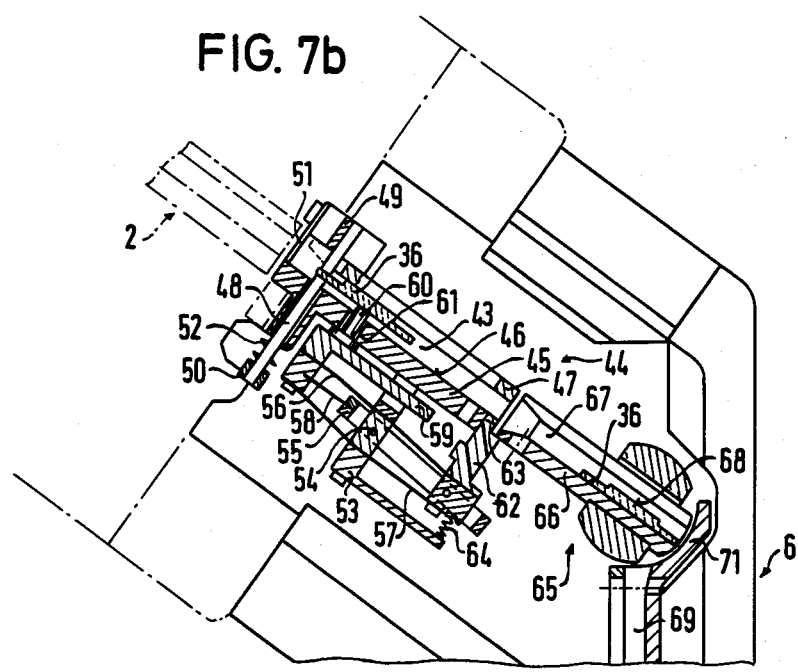
FIGS. 7a and 7b show sections through the isolating apparatus and the tipping apparatus in various positions.
Figure 7A:
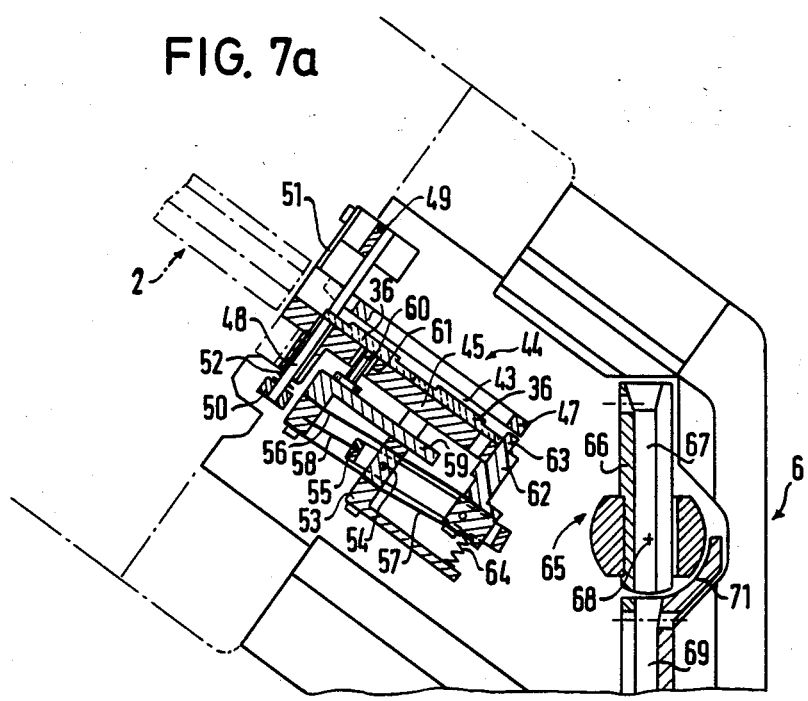

The tipping apparatus 65 cooperates with the isolating apparatus 44, and the interaction is shown in FIGS. 7a and 7b. It essentially lies in the fact that the tipping part 66, in the receiving position shown in FIG. 7b, presses on a shoulder 70 of the closing part 62 and holds the latter, in opposition to the action of the spring 64, in a lower position such that the closing lug 63 unblocks the path between the isolating channel 43 and the tipping channel 67. At the same time, the pendulum frame 55 is rotated about the point of rotation 54 with the result that this movement is transmitted by way of the leaf springs 56, 57, 58 to the clamping ram carrier 59 which, as a result, is forced into an upper position in which the clamping ram 60 dips through the hole 61 in the base part 46 into the isolating channel 43, and presses a component located above it against the cover plate 47, and as a result, does not prevent it from slipping on further.

The functioning of the isolating apparatus is now as follows:

In the first instance, the slide 51 is opened so that, as shown in FIG. 7a, two components can slip into the isolating channel 43 and there meet with the closing lug 63. The length of the isolating channel 43 is dimensioned exactly so that it corresponds to the length of two components 36. As shown in FIG. 7b, the slide 51 is then closed again and the tipping apparatus 65 is rotated in such a way that the tipping part 66 presses the closing part 62 downwards. As a result, the closing lug 63 unblocks the path between the isolating channel 43 and the tipping channel 67. At the same time, the clamping ram 60 is pressed upwards and presses the component 36, the rearmost component in the direction of transportation, against the cover plate 47. The component 36, forwards in the direction of transportation, can now slip into the tipping channel 67. It cannot, however, leave this channel, because the tipping channel is closed at its lower end by means of an arc-shaped blocking part 71. Accordingly, the tipping apparatus 65 is swung back into the position shown in FIG. 7a with the result that the tipping channel 67 is in alignment with the test channel 69 and the component located in the tipping channel 67 can slip into the checking channel 69. At the same time, the closing lug 63 again closes the isolating channel 43 and the clamping ram 60 is drawn back out of the isolating channel 43. As a result, the rearmost component, can slip on until it meets with the closing lug 63. Upon renewed opening of the slide 51, a further component can now slip out of the magazine channel into the isolating channel 43. When a magazine channel of the input magazine is empty, the slide 51 closes. The input magazine 2 is now moved laterally until the next magazine channel comes to lie in front of the isolating channel. The slide 51 now opens again until the band elements of this magazine channel are also worked off. This process takes place in a sequence which is repeated.

Further handling of the components will be described with the aid of FIG. 6. If the tipping apparatus 65 is rotated out of the inclined position shown in FIG. 7b into the vertical position (as in FIG. 7a), the component contained therein falls into the test channel 69 of the test apparatus 72. It first meets with a stop 73 which is shown in an advanced position. The stop 73 is connected with the piston 75 of a pneumatic cylinder 76 by a ram 74. A spring 77 acts to keep the stop 73 in the open position. If air is sent to the pneumatic cylinder, the stop 73 is pushed into the position shown in FIG. 6 against the action of the spring 77.

If the stop 73 is drawn back, the component falls on through the test channel 69 into a test cage 78. The test cage is connected with the piston 80 of a further pneumatic cylinder 81 by way of a ram 79. A spring 82 acts to keep the test cage 78 in the withdrawn position represented. If pressure is transmitted to the cylinder 81, the test cage 78 is displaced, with the component located inside it, to the right by a small amount.

A further stop 83, which is connected with the piston 85 of a pneumatic cylinder 86 by way of a ram 84, is located below the test cage. A spring 87 acts to force the stop 83 into a withdrawn position. If air is sent to the pneumatic cylinder 86, the stop 83 is advanced into the position shown in FIG. 6 against the action of the spring 87. In the advanced position, the stop 83 holds the component in the test cage.

Figure 9A:
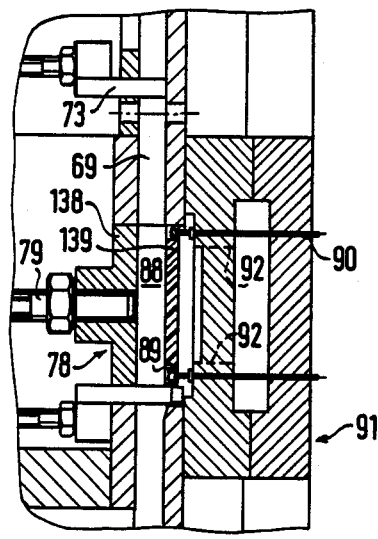
FIG. 9a shows a section through the test pin holder and the test cage for CLCC's.
Figure 9B:
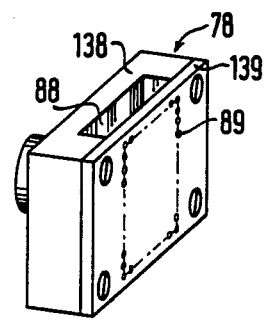
FIG. 9b shows a perspective representation of the test cage for CLCC's.

The test cage 78 is represented, on an enlarged scale, in section in FIG. 9a and in perspective in FIG. 9b. It consists of a milled metal portion 138 with a plastic plate 139 mounted thereon. These enclose a test area 88 forming a part of the test channel 69. The plastic plate 139 is provided with holes 89 arranged in a square. The end sections of test pins 90 protrude into the holes 89. Both end sections of the test pins 90 may be displaced telescopically in respect of the central portion. The end sections of the test pins 90 protruding into the holes 89 are provided with serrated contact crowns. The test pins are arranged in a two-part test pin holder 91 which is made of insulating material. The end sections of the test pins 90, which protrude to the right out of the test pin holder 91 and which may be displaced telescopically, are brought into contact with the connector 7 shown in FIG. 1. It is also possible to take the part indicated by means of the broken lines 92 out of the test pin holder 91 in order to create space for earth capacitance which can be brought quite close to the end sections of the test pins. The conditions which prevail after the components have been soldered onto the printed circuit board can be simulated with said earth capacitance.

Figure 11:
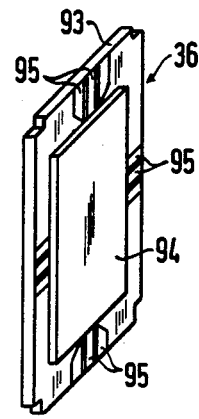
FIG. 11 shows a perspective representation of a CLCC.

Components of the kind shown in FIG. 11 come into consideration for the test cage 78 previously described and also for the corresponding test pins 90. In this case, it is a question of a so-called CLCC (ceramic leadless chip carrier). This CLCC consists of a basic ceramic body 93 which is provided with a raised part 94 in the centre. Gilt contact paths 95 extending up to the edge of the basic ceramic body 93 extend from this raised part 94 on all four sides. In FIG. 11, for the sake of simplicity, only a few contact paths 95 are indicated. The contact crowns of the end sections of the test pins 90 extending through the holes 89 of the test cage touch down upon these gilt contact paths 95 when the test cage 88 is displaced to the right of the position shown in FIG. 9a.

Figure 10A:
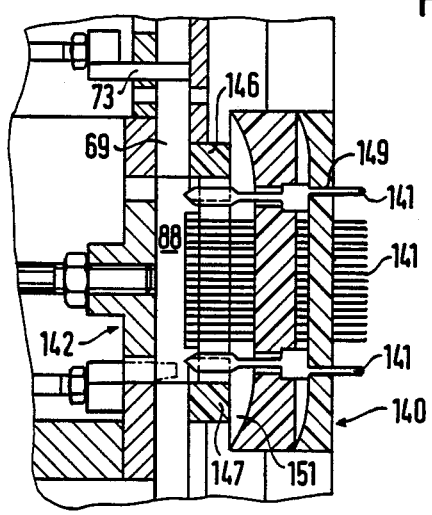
FIG. 10a shows a section through the test pin holder and the test cage for PLCC's.
Figure 10B:
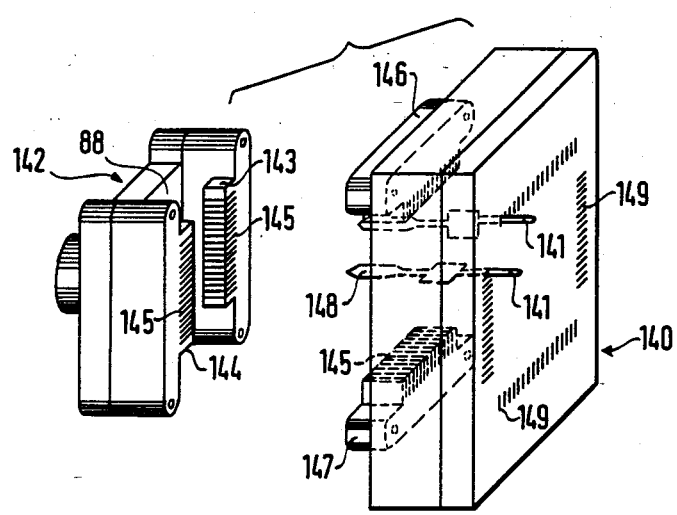
FIG. 10b shows a perspective exploded representation of the test pin holder and test cage for PLCC's.
Figure 12:
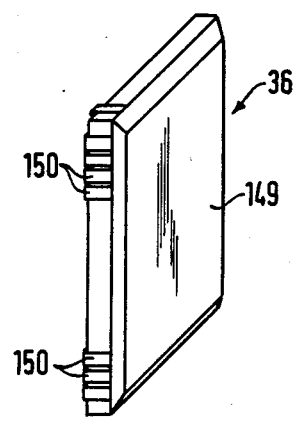
FIG. 12 shows a perspective representation of a PLCC.

Instead of the CLCC's shown in FIG. 11, PLCC's can also be used, as shown in FIG. 12. These consist of a plastic housing 149 from whose edges there extend on all four sides connecting contacts 150 which are bent inwards on the underside. The connecting contacts are tinned. As tin corrodes, a reliable contact can only be guaranteed if the test pins are brought into frictional contact with the connecting contacts 150. FIGS. 10a and 10b show a test cage 142 and a corresponding test pin holder 140 which meet these conditions. The two-part test pin holder 140 is made of synthetic material. It is provided with slots 149 into which test pins 141 are plugged. The test pins are punched out of contact sheet metal. At their left-hand end they have a widened contact region 148. The test pins are to come into frictional contact with the connecting contacts of the PLCC's with the lateral front edges of said widened contact regions 148. For this purpose, they must be supported at the side. Thus, the test pin holder 140 has at the top and bottom on its left-hand side projections 146, 147, provided with slots 145 into which the widened contact regions 148 of the test pins 141, which are arranged in the upper and lower series, protrude over the extreme part of their width. The test cage 142, likewise produced of insulating material and preferably of synthetic material, is, viewed from above, constructed in the shape of a C and encloses a test area 88. At the two vertical sides the cage 142 is provided with strips 143, 144, which project inwards and which also have slots 145. The widened contact regions 148 of those test pins 141 which are arranged in the two vertical test pin series protrude into these slots. In this case also, the widened contact regions 148 do not protrude into the slots 145 over their whole width, but only over the extreme part of their width. If the test cage 142, shown in FIG. 10a, is displaced towards the right, the widened contact areas 148, beveled at the front, of the test pins 141 come into frictional contact with the contact paths 150 of the PLCC's (FIG. 12). The test pin holder 140 is also provided here with just one free area 151 in which, if desired, earth capacitance can be accommodated.

The rest of the course of the components will now be described in turn with the aid of FIG. 6. Added to the lower part of the test channel 69, that is, that part which follows the test cage 78, there is a turning apparatus 93. This consists of a turning part 95 which may be rotated about an axis 94 and which contains a turning channel 96. The turning channel 96 is closed at the end.

Figure 6:
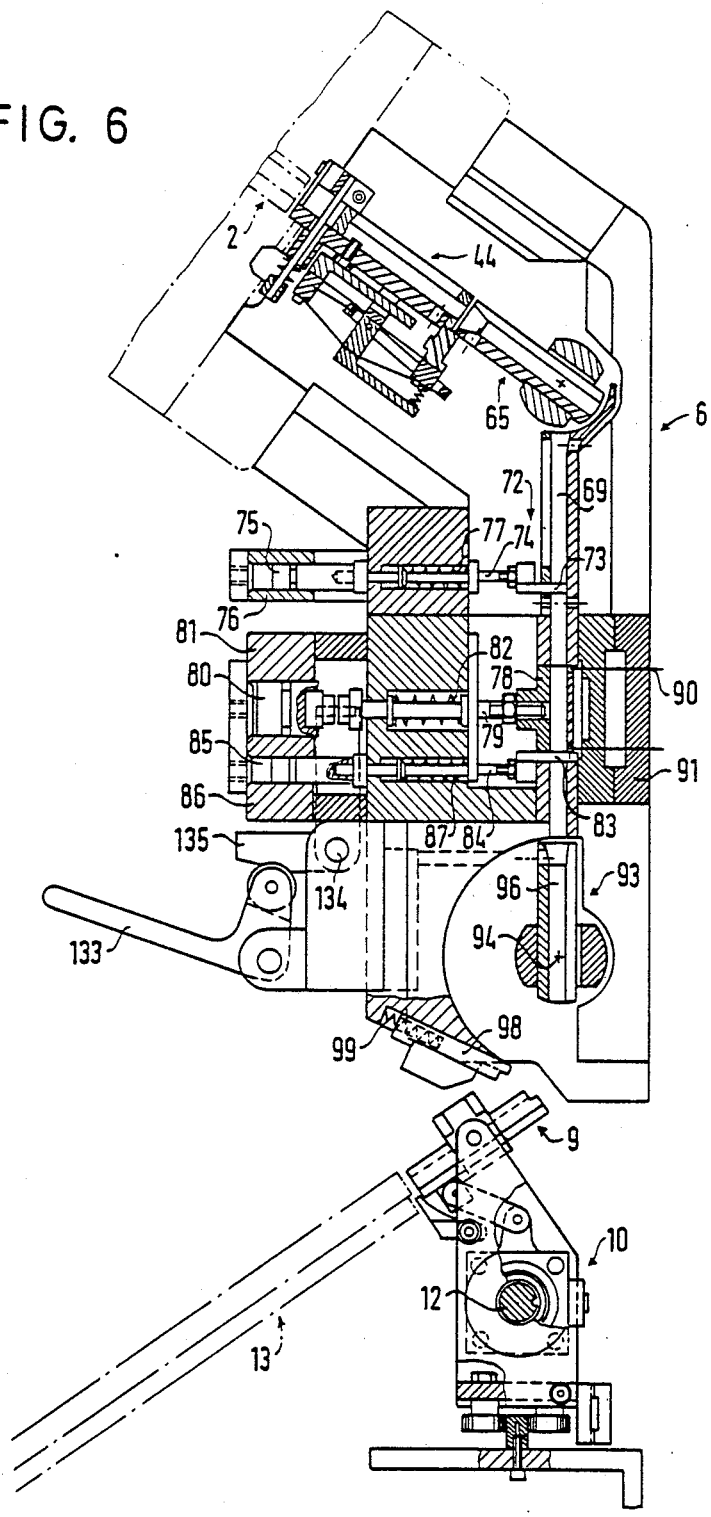
FIG. 6 shows a section through the checking unit and the shuttle.

If the test cage 78 is drawn back into the position shown in FIG. 6 after a component located therein has been examined and the stop 83 is displaced towards the left, the component located in the test area 88 drops into the turning channel 96. The transfer of this component into the shuttle 9 and thence into the output magazine 13 will now be described with the aid of FIGS. 8a to 8c.

Figure 8A:
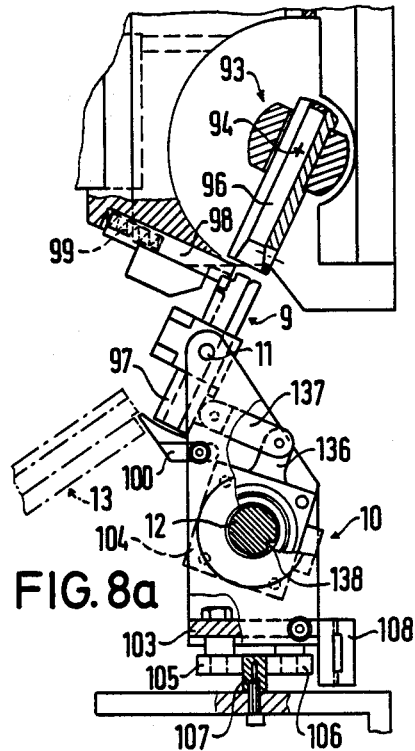
FIGS. 8a to 8c show sections through the turning apparatus and the shuttle in various positions.

The shuttle 9 can occupy three positions. FIG. 8a shows the shuttle 9 in the loading position. The shuttle 9 is provided with a shuttle channel 97 for the purpose of taking up a component. A closing part 98 which normally closes the open end of the turning channel 96 is pressed back, against the action of a spring 99, by means of the shuttle, so that the turning channel 96 is opened and the component located therein can slide into the shuttle channel 97, which is in alignment with the turning channel 96. The component is prevented from falling out of the shuttle channel 97 by a blade located on the shuttle sliding carriage 10, the upper side of the blade having a cylindrical bend running about the axis of rotation 11 of the shuttle 9.

Figure 8C:
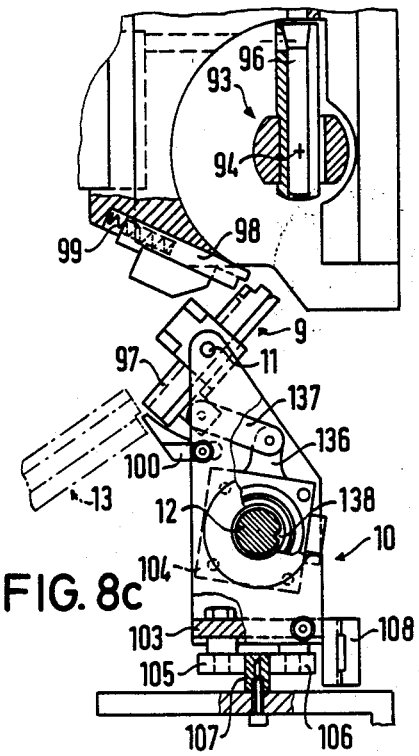
Figure 8B:
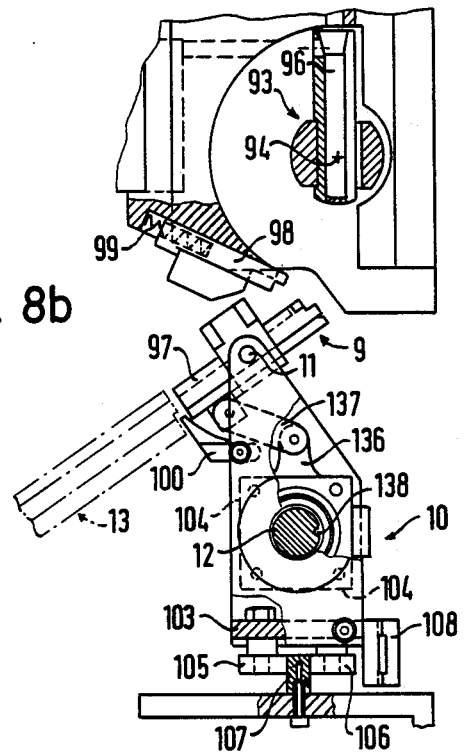

FIG. 8b shows the shuttle 9 in the unloading position. In this case the shuttle channel 97 is in alignment with a magazine channel of the output magazine. The upper end of the blade 100 extends straight to the lower edge of the shuttle channel 97. A component located in the shuttle channel 97 can, accordingly, slide into the corresponding magazine channel of the output magazine 13. The turning apparatus 93 is again rotated upwards (as FIG. 6).

FIG. 8c shows the shuttle 9 in the transporting position. This transporting position is an intermediate position between the loading position and the unloading position. On the one hand, the blade 100 closes the lower end of the shuttle channel 97. On the other hand, the shuttle 9 no longer presses against the closing part 98 (as in FIG. 8a). The closing part 98 is therefore in an advanced position and would close the turning channel 96 if the turning apparatus 93 were rotated downwards (as in FIG. 8a).

The rest of the arrangement of the shuttle 9 and the shuttle sliding carriage 10 and the transportation of the shuttle will now be explained with the aid of FIG. 5. The shuttle sliding carriage 10 has two side walls 101, 102 which are connected together by a base portion 103. The axis of rotation 11 of the shuttle 9 extends between the two side walls 101, 102. Furthermore, a ball box 104 extends between the two side walls 101, 102 in a rotatable manner. This box is connected with the guide rod 12 in a manner secure against rotation, yet so that it may be displaced thereon. The guide rod 12 has, for this purpose, a groove 138 in which a ball series of the ball box 104 runs to achieve the longitudinal displaceability and the rotational slaving. The ball box 104 has an attachment 136 which is connected with the shuttle 9 by way of a lever 137 in an articulated manner and transmits rotation of the ball box 104 to the shuttle 9.

As can be inferred from FIG. 6 and FIGS. 8a to 8c, two rollers 105, 106 which rest against opposite sides of a guide rail 107, fixed to the equipment, sit on the underside of the base portion 103. This rail is not shown in FIG. 5 for the sake of clarity. Likewise connected with the base portion 103, there is a clamping portion 108, by means of which the shuttle sliding carriage 10 is connected with a toothed belt 109. The toothed belt 109 runs over two sprockets 110, 111 which are fixed to the equipment. The sprocket 110 is connected with a driving motor 112. When the driving motor 112 is set into operation, the shuttle sliding carriage is displaced by the action of the toothed belt 109 on the guide rod 12.

Figure 5:
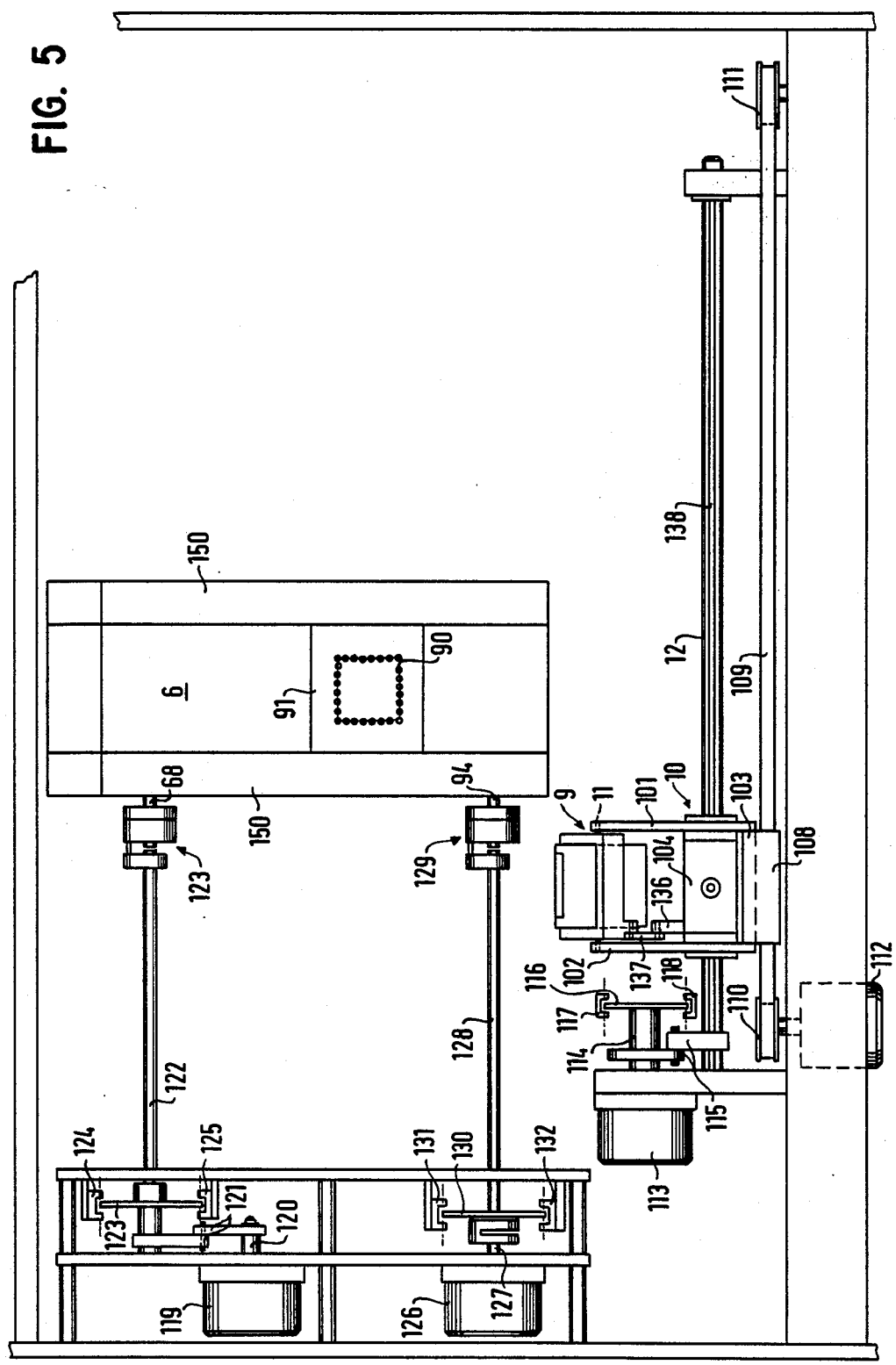
FIG. 5 shows a view, looking towards the apparatus in the direction of arrow V in FIG. 1, from behind, (without connector).

The drive for rotating the shuttle 9 is established by a stepping motor 113 (see FIG. 5). The driving shaft 114 of the motor 113 is connected with the guide rod 12 by an eccentric mechanism 115. Furthermore, the driving shaft 114 of the motor 113 bears a slotted disc 116 with two slots (not shown) which are scanned by light gates 117, 118. The two slots define the loading position (FIG. 8a) and the unloading position (FIG. 8b) of the shuttle 9. The transporting position (FIG. 8c) is less critical than the two previously named positions. It is merely determined through stepping pulses fed to the stepping motor 113. The eccentric coupling between the motor 113 and the guide rod 12 makes possible sufficient power transmission in the loading position of the shuttle 9 (FIG. 8a), in which the shuttle 9 must displace the closing part 98 against the force of the springs 99.

FIG. 5 shows, furthermore, the drives for the tipping apparatus 65 and the turning apparatus 93. The drive for the tipping apparatus is established by a stepping motor 119. The driving shaft 120 of the motor 119 is also connected here in turn, by way of eccentric rods 121, with a connecting shaft 122 which is coupled, by way of a releasable coupling 123, with the rotational axis 68 of the tipping apparatus 65 (FIGS. 7a and 7b). The eccentric rods 121 are necessary so that the tipping apparatus can press the closing part 62 downwards, against the force of the spring 64, in the tipping position shown in FIG. 7b. Furthermore, on the connecting shaft 122 there sits a slotted disc 123 having two slots (not shown) which define the two positions of the tipping apparatus 65 in FIGS. 7a and 7b. The slots are scanned by means of light gates 124 and 125.

The drive for the turning apparatus 93 (FIGS. 6 and 8a to 8c) is established by a stepping motor 126. The output shaft 127 of the motor 126 is a coupling directly connected with a connecting shaft 128 which, for its part, is coupled by way of a releasable coupling 129 with the rotational axis 94 of the turning apparatus. On the connecting shaft 128 there again sits a slotted disc 130 having two slots (not shown) which are scanned by two light gates 131, 132. The slots define the two positions of the turning apparatus 93 shown in FIGS. 8a and 8b.

FIG. 5 also shows the test unit 6 from the rear. The ends of the test pins 90 in the test pin holder 91, onto which pins the connector 7 (see FIG. 1) is plugged, for connection to the evaluating computer, can be seen.

As already mentioned, when testing different components (IC's) both the input magazine 2 and the output magazine 13 as well as the whole test unit 6 must be exchanged. Moreover, when constructing the device care was taken to see that the guide channels for the components are constantly accessible in case a component should remain stuck. To this purpose, the guide channels are formed in the shape of a C over the greatest part of their length. For this reason, as shown in FIG. 6, the block containing the cylinders 81 and 86 and also the test cage 78 can be taken out of the test unit if the lever 133 is rotated downwards and a clamping fork 135, which is only visible in the attachment and which may be rotated about an axis 134, is tilted away from the block mentioned. Furthermore, the tipping apparatus 65, likewise visible in FIG. 6, and the turning apparatus 93 are constructed in such a way that components located therein are also accessible from one side. This also holds good for the isolating apparatus 44 and the shuttle 9.

All the parts which contain channels guiding components are preferably produced of metal. However, in the case of the test cage, those parts coming into contact with the test pins or the contact paths of the components must be made of an insulating material, and preferably a synthetic material, so that the test pins or the contact paths have no electrical connection. The same is true for the test pin holder.

The following should also be noted in connection with FIG. 5: the test unit 6 is provided with lateral plates 150 for high or low temperature insulation. If one or both of the plates 150 are removed, further test units 6 can be applied, the tipping apparatus and turning apparatus of which units are likewise actuated by the stepping motors 119 and 126, the corresponding axle shafts being coupled in a simple manner. In this way, several test units 6 can be operated in parallel. The number of test units 6 which may be operated in parallel depends upon the time required by the evaluating computer. This is longer, the more connecting contacts the components have. The time of evaluation can thus be so long that several test units 6 are loaded with components by a single input magazine 2 one after another and are unloaded by a single shuttle one after another.

Instead of a movable input magazine 2, a fixed input magazine can also be used. In this case, a shuttle can likewise be provided between the input magazine and the test unit.

It is also possible to use a movable output magazine instead of the fixed output magazine and then economise on the shuttle previously provided between the test unit and the output magazine.

The CC components (chip carrier) have a free rear surface. The concept of passage for these IC components in the device described above is chosen so that the components run both into the input magazine and, after testing, into the output magazine, on their free rear surface. At any rate, the CC components are rotated by 180° when running into the output magazine in such a way that that front surface which is at the front in the input magazine in the direction of transportation, now lies at the back in the output magazine. This rotation is necessary because the CC components are, as a rule, transported in magazine rods in which they are arranged one after the other in series. The untested components are introduced into a magazine channel of the input magazine as a stack magazine filled with components has its filling end applied to the input of the magazine channel, whereupon the components slip into the magazine channel. An empty stack magazine is filled with tested components by applying the filling end of the empty stack magazine to the output of the output magazine, the tested components then slipping out of the relevant magazine channel of the output magazine into the stack magazine. The components must be orientated in a certain direction in the rod magazine in such a way that, for example, a connecting contact located on a front of the component (e.g. a NULL - pin) points to the filling end of the rod magazine. In order to guarantee this, the 180° rotation of the components in the manner previously described is necessary. It is achieved by means of the turning apparatus previously connected to the shuttle.

We claim

1. A device for testing and sorting electronic components, and more particularly integrated circuit chips, having an input magazine for untested components and an output magazine for tested components, at least one of which magazines has, for the components, a flat base plate, a plurality of parallel magazine channels arranged on a gradient with T-shaped guide rails forming limits of the magazine channels and nesting with their vertical limbs upon the base plate, means for mounting the guide rails such that they limit the magazine channels at the side, means for connecting the guide rails with each other to form a block which, as a whole, is capable of being exchanged and, a plurality of annular brake rollers protruding through the gap formed by adjacent T-shaped cross-sectional guide rails, said brake rollers suspended on carrier rods which run transverse to the direction of transportation of the components, such that the internal diameter of the inner brake rollers is substantially greater than the diameter of the carrier rods and such that the brake rollers sit on the base plate and may be lifted by components slipping down in the magazine channels, thereby reducing the components' slipping speed.

2. A device for testing electronic components, and more particularly integrated circuit chips, in which the components are guided through a test channel, the test channel containing a test cage further containing a test area where the connecting contacts of the components are connected with corresponding test contacts by displacing the components, by means of a displacement drive, in a direction transverse to the direction of transportation, the test contacts being formed by test pins arranged in a fixed manner in a test pin holder and for components with gold contacts, more particularly, CLCC's, the test pins protrude into the test area through holes in the test cage such that the component may be contacted upon displacement.

3. A device according to claim 2, characterised in that the end region of the test pins facing the test cage may be displaced telescopically in respect of the main part of the test pins and a pin head, preferably in the form of a serrated crown, is provided in this end region.

4. A device for testing and sorting electronic components, more particularly integrated circuit chips, comprising an input magazine for untested components, a test unit with a test channel to which components are fed successively from the input magazine, a stationary output magazine with a plurality of inclined magazine channels arranged side by side for tested components, a shuttle sliding carriage which may be moved between the output magazine and the test unit, and a shuttle which is arranged on the shuttle sliding carriage and which has a shuttle channel for transferring the components from the test channel output to the input of a selected magazine channel, means for adjusting the shuttle between an unloading position, in which the shuttle channel and the selected magazine channel are in alignment, and a transporting position in which the shuttle channel and the selected magazine channel are out of alignment, characterized in that the shuttle sliding carriage is only constructed for the purpose of executing the conveying movement such that the shuttle may be adjusted in respect of the shuttle sliding carriage between the unloading position and the transporting position, and a stop portion provided on the shuttle sliding carriage which does not participate in the movement of adjustment of the shuttle and which blocks the shuttle channel in the position of transportation, characterized in that the stop portion has, on its side facing the shuttle, a cylindrically curved surface which tapers at the end such that the stop portion lies with its tapered end in the gap between the shuttle and the output magazine.

5. A device according to claim 4, characterised in that the movement of adjustment of the shuttle takes place through rotation about an axis which runs approximately through the centre of a component located in the shuttle channel.

6. A device according to claim 4, further including means by which the shuttle is capable of being adjusted and moved into a loading position in which it is closed on its output side by means of the stop portion, and is capable of being brought, on its input side, into correspondence with a rotating apparatus which contains a rotating channel, such that the shuttle channel and the rotating channel are in alignment with one another.

7. A device according to claim 6, characterised in that the rotating channel of the rotating apparatus is closed at one end, and further including means by which the rotating apparatus may be rotated, about an axis, between a loading position, in which the rotating channel is in alignment with the test channel, and an unloading position, in which the rotating channel is in alignment with the shuttle channel.

8. A device according to claim 7, characterised in that the shuttle sliding carriage has a sliding portion, which is mounted on a guide rod in a longitudinally displaceable manner yet is connected therewith in a manner secure against rotation, and in that the sliding portion is connected with the shuttle for the purpose of transmitting the rotational movement.

9. A device for testing and sorting electronic components, and more particularly integrated circuit chips, having an input magazine on a gradient for untested components, an isolating apparatus which is arranged at the output end of the input magazine and which contains an isolating channel likewise on a gradient, and a test unit, to which the components are fed successively, characterised in that the isolating apparatus has two stopping elements, which are arranged one after another with interspacing in the direction of transportation of the components, which are capable of being adjusted transverse to the direction of transportation and which are connected with each other through a pendulum mechanism, by means of which alternately the one stopping element is dipped into the isolating channel, whilst the other is drawn out of said channel, and vice versa, the pendulum mechanism comprising a pendulum frame, its one end being connected with the stopping element lying upstream in the direction of transportation of the components, such that the pendulum frame is pivoted about an axis of rotation transverse to the direction of transportation of the components, the other end of the pendulum frame being connected by way of a leaf spring with the stopping element lying downstream in the direction of transportation of the components, and the two stopping elements are connected directly together by way of at least one further leaf spring.

10. A device according to claim 9, characterised in that the two stopping elements are separated by a distance of approximately one and a half lengths of the components to be isolated, so that the stopping element lying downstream in the direction of transportation in dipping into the isolating channel clamps the penultimate component.

11. A device according to claim 9, characterised in that the two stopping elements are mounted in a resilient manner to avoid damage to the components.

12. A device according to claim 9, characterised in that the stopping element lying upstream in the direction of transportation of the components is pretensioned by means of a pretension spring in such a way that it dips into the isolating channel or closes it at the end.

13. A device according to claim 12, characterised in that added to the isolating apparatus in the direction of transportation of the components there is a tipping apparatus which has a tipping channel, that the tipping apparatus is capable of being tipped about a tipping axis, which runs crosswise to the direction of transportation of the components, between a loading position and an unloading position, said tipping apparatus in the loading position pressing the stopping element lying upstream in the direction of transportation of the components against the action of the pretension spring in the position of release and the tipping channel coming to lie in alignment with the isolating channel, so that the last component can run into the one end of the tipping channel until it meets with a stationary stop at the other end of the tipping channel, and the tipping channel of the tipping apparatus being in alignment in the unloading position with a test channel of the test unit in such a way that the component in the unloading position can run out of the tipping channel, which in this case is no longer closed by the stationary stop, into the test channel.

14. A device according to claim 9, characterised in that the two stopping elements dip from below into the oblique isolating channel, the stopping element which lies downstream in the direction of transportation of the components pressing the penultimate component, when dipping in, against the upper isolating channel limit, whilst the stopping element lying upstream, when dipping in, blocks the transporting channel or forms a stop for the last component.

15. A device for testing and sorting electronic components, and more particularly integrated circuit chips, in which components are guided through a test channel, the test channel containing a test cage further containing a test area where connecting contacts of the components are connected with corresponding test contacts by displacing the components by means of a displacement drive in a direction transverse to the direction of transportation, the test contacts being formed by test pins arranged in a fixed manner in a test pin holder, the test pins characterized in that for components to be tested having tinned connecting contacts, more particularly PLCC's, they are made of flat sheet metal and are guided in supporting slots of the test pin holder and/or the test cage such that they are supported at their edge remote from the component to be tested and where the dimension are chosen such that the connecting contacts of the component located in the test cage are caused to come into fractional contact with the other edge of the test pins upon displacement of the test cage.

16. A device according to claim 15, characterised in that the test pins have, in the region in which they are to touch the connecting contacts of the components to be tested, a widened section which tapers at the end.

17. A device according to claim 15, characterised in that both the test pin holder and the test cage are each provided on two opposite sides with projections, containing the supporting slots for the test pins.

* * * * *